(12) United States Patent
Yokoyama et al.

(10) Patent No.: US 10,386,420 B2
(45) Date of Patent: Aug. 20, 2019

(54) SECONDARY BATTERY DEGRADATION DETERMINATION METHOD AND SECONDARY BATTERY DEGRADATION DETERMINATION DEVICE

(71) Applicants: Furukawa Electric Co., Ltd., Tokyo (JP); Furukawa Automotive Systems Inc., Inukami-gun (JP)

(72) Inventors: Koichi Yokoyama, Tokyo (JP); Etsuzo Sato, Shiga (JP)

(73) Assignees: FURUKAWA ELECTRIC CO., LTD., Tokyo (JP); FURUKAWA AUTOMOTIVE SYSTEMS INC., Inukami-gun (JP)

(*) Notice: Subject to any disclaimer, the term of this patent is extended or adjusted under 35 U.S.C. 154(b) by 330 days.

(21) Appl. No.: 14/829,035

(22) Filed: Aug. 18, 2015

(65) Prior Publication Data
US 2015/0355288 A1    Dec. 10, 2015

Related U.S. Application Data

(63) Continuation of application No. PCT/JP2013/080077, filed on Nov. 7, 2013.

(30) Foreign Application Priority Data

Feb. 19, 2013 (JP) .................................. 2013-030322

(51) Int. Cl.
*G01R 31/392* (2019.01)
*H01M 10/42* (2006.01)
(Continued)

(52) U.S. Cl.
CPC ......... *G01R 31/392* (2019.01); *G01R 31/389* (2019.01); *H01M 10/4285* (2013.01); *H02J 7/1461* (2013.01)

(58) Field of Classification Search
CPC ........... G01R 31/3679; G01R 31/3662; H01M 10/4285; H02J 7/00
See application file for complete search history.

(56) References Cited

U.S. PATENT DOCUMENTS

| 8,036,839 B2 | 10/2011 | Machiyama et al. |
| 8,159,189 B2 * | 4/2012 | Zhang ................ G01R 31/3679 320/136 |

(Continued)

FOREIGN PATENT DOCUMENTS

| JP | 2007-278853 A | 10/2007 |
| JP | 2008-087654 A | 4/2008 |

(Continued)

OTHER PUBLICATIONS

Office Action dated Aug. 2, 2016 in Chinese Patent Application No. 201380060704.1 (with partial English translation).

(Continued)

*Primary Examiner* — Khamdan N. Alrobaie
(74) *Attorney, Agent, or Firm* — Oblon, McClelland, Maier & Neustadt, L.L.P.

(57) ABSTRACT

Provided are a secondary battery degradation determination method and a secondary battery degradation determination device which can detect degradation of a secondary battery in advance even before an engine starts. When it is determined in Step S1 that a vehicle is in a stop state, a stable-state open-circuit voltage OCV is measured in Step S2 and internal resistance R1 is calculated in Steps S3 and S4. On the other hand, when it is determined in Step S1 that a starter 21 is operated, a maximum discharge current value Inew is measured in Step S5 and a maximum discharge current value Is is updated in Steps S6 and S7. In Step S14, a minimum voltage Vs is calculated. In Step S15, the stable-state open-circuit voltage OCV and the minimum (Continued)

voltage Vs are compared with predetermined threshold values to perform the degradation determination of a secondary battery 10.

16 Claims, 6 Drawing Sheets

(51) Int. Cl.
    *G01R 31/389*    (2019.01)
    *H02J 7/14*       (2006.01)

(56) References Cited

U.S. PATENT DOCUMENTS

| | | | | |
|---|---|---|---|---|
| 2005/0035742 | A1* | 2/2005 | Koo | G01R 31/3624 |
| | | | | 320/149 |
| 2007/0194756 | A1* | 8/2007 | Cutrona | G01R 31/362 |
| | | | | 320/132 |
| 2008/0103709 | A1* | 5/2008 | Yun | H01M 10/486 |
| | | | | 702/63 |
| 2008/0120050 | A1* | 5/2008 | Iwane | G01R 31/3679 |
| | | | | 702/63 |
| 2008/0150457 | A1* | 6/2008 | Salman | B60L 3/12 |
| | | | | 318/139 |
| 2009/0088994 | A1* | 4/2009 | Machiyama | H01M 10/48 |
| | | | | 702/63 |
| 2009/0102431 | A1* | 4/2009 | Kung | H02J 7/0031 |
| | | | | 320/162 |
| 2014/0145684 | A1* | 5/2014 | Liu | H01M 10/44 |
| | | | | 320/152 |
| 2015/0108991 | A1* | 4/2015 | Aoshima | G01R 31/3648 |
| | | | | 324/430 |

FOREIGN PATENT DOCUMENTS

| | | |
|---|---|---|
| JP | 4457781 B2 | 4/2010 |
| JP | 4626559 B2 | 2/2011 |

OTHER PUBLICATIONS

International Search Report dated Feb. 18, 2014 for PCT/JP2013/080077 filed on Nov. 7, 2013 in English Language.

* cited by examiner

SECONDARY BATTERY DEGRADATION DETERMINATION METHOD AND SECONDARY BATTERY DEGRADATION DETERMINATION DEVICE

TECHNICAL FIELD

The present invention relates to a secondary battery degradation determination method and a secondary battery degradation determination device which determine degradation of a secondary battery.

BACKGROUND ART

In the related art, for example, Patent Documents 1 and 2 disclose a technique for determining degradation of a secondary battery provided in a vehicle. Patent Document 1 discloses a technique which measures an open-circuit voltage OCV and a minimum voltage Vst when the engine starts and detects the degradation of the secondary battery using a characteristic map defining the relation between OCV and Vst. The characteristic map is divided into five regions corresponding to the levels of OCV and Vst and the boundary between the regions is divided by a logarithmic curve or a straight line.

Patent Document 2 discloses a technique which determines the degradation of the secondary battery using a map indicating the relation between internal resistance R and an open-circuit voltage OCV corresponding to the degree of degradation of the secondary battery. This technique measures a current and a voltage before the engine starts and a current and a voltage when the integrated value of a discharge current after the engine starts reaches predetermined quantity of electricity and calculates the internal resistance R using these measured values.

CITATION LIST

Patent Document

Patent Document 1: Japanese Patent No. 4626559
Patent Document 2: Japanese Patent No. 4457781

DISCLOSURE OF THE INVENTION

Problem to be Solved by the Invention

However, the secondary battery degradation determination method and the secondary battery degradation determination device according to the related art determine the degradation using the current and voltage when the engine actually starts. Therefore, there is a problem in that it is difficult to detect the degradation of the secondary battery until the engine starts. In addition, for example, when the vehicle is stopped for a long time and the secondary battery degrades, it is difficult to detect the degradation of the secondary battery until the engine starts.

The minimum voltage of the secondary battery when the engine starts is also affected by the temperature of the secondary battery. For example, there is a problem in that, when the temperature of the secondary battery is high, the minimum voltage is estimated to be high and it is difficult to determine degradation with high accuracy. Therefore, for example, there is a concern that the engine will not start even in the following case: the secondary battery is determined to be normal with its temperature at a high value, and the engine is stopped; and thereafter the engine is operated to start when the temperature of the secondary battery is lowered.

The invention has been made in order to solve the above-mentioned problems and an object of the invention is to provide a secondary battery degradation determination method and a secondary battery degradation determination device which can detect degradation of a secondary battery in advance even before an engine starts.

Means for Solving Problem

A first aspect of a secondary battery degradation determination method of the present invention is characterized by including: a driving state determination step of determining a driving state of a vehicle provided with a secondary battery on the basis of a current value of the secondary battery; an open-circuit voltage measurement step of measuring an open-circuit voltage OCV of the secondary battery; an internal resistance calculation step of detecting a current and a voltage between terminals while the secondary battery is being discharged and calculating internal resistance R1 of the secondary battery; a maximum current detection step of, when a predetermined load provided in the vehicle is operated with a discharge current equal to or greater than a predetermined value, detecting a maximum discharge current value Inew which is a maximum value of the discharge current; a maximum current update step of comparing the detected maximum discharge current value Inew with a stored maximum discharge current value Is, updating the maximum discharge current value Is to the larger of the two maximum discharge current values, and storing the updated maximum discharge current value; a temperature detection step of detecting a temperature of the secondary battery; a state-of-charge estimation step of estimating a state of charge of the secondary battery; an internal resistance correction step of correcting the internal resistance R1 to internal resistance R1c at a predetermined reference temperature, on the basis of the state of charge estimated in the state-of-charge estimation step and the temperature detected in the temperature detection step, using a table or a relational expression which is made in advance to indicate a relation between the internal resistance and the state of charge and temperature of the secondary battery; a minimum voltage calculation step of calculating a minimum voltage Vs of the secondary battery when the load is operated based on the following expression:

$$Vs = OCV - R1c \times Is$$

using the open-circuit voltage OCV, the corrected internal resistance R1c, and the maximum discharge current value Is; and a degradation determination step of determining that the secondary battery has degraded when the open-circuit voltage OCV is equal to or greater than a first threshold value and the minimum voltage Vs is less than a second threshold value.

Another aspect of the secondary battery degradation determination method of the present invention is characterized in that in the internal resistance calculation step, the secondary battery is discharged in a predetermined discharge pattern, a current and a voltage between the terminals are detected while the secondary battery is discharged in the predetermined discharge pattern, and the internal resistance R1 of the secondary battery is calculated; when the vehicle is determined to be in a stop state in the driving state determination step, the open-circuit voltage measurement step and the internal resistance calculation step are performed; when the load is determined to be operated in the driving state determination step, the maximum current detection step and the maximum current update step are performed; and when the degradation determination of the secondary battery is performed, the temperature detection step, the state-of-charge estimation step, the internal resistance correction step, the minimum voltage calculation step, and the degradation determination step are performed.

Another aspect of the secondary battery degradation determination method of the present invention is characterized in that the predetermined discharge pattern is a substantially square wave including a predetermined discharge frequency of the discharge current when the load is operated.

Another aspect of the secondary battery degradation determination method of the present invention is characterized in that the internal resistance calculation step is performed in a predetermined cycle or in response to a predetermined execution request when the vehicle is in the stop state.

Another aspect of the secondary battery degradation determination method of the present invention is characterized in that in the internal resistance calculation step, the internal resistance R1 of the secondary battery is calculated using a load current and a response voltage before and after the load is operated; when the vehicle is determined to be in a stop state in the driving state determination step, the open-circuit voltage measurement step is performed; when the load is determined to be operated in the driving state determination step, the internal resistance calculation step, the maximum current detection step, and the maximum current update step are performed; when the degradation determination of the secondary battery is performed, the temperature detection step, the state-of-charge estimation step, the internal resistance correction step, the minimum voltage calculation step, and the degradation determination step are performed.

Another aspect of the secondary battery degradation determination method of the present invention is characterized in that in the open-circuit voltage measurement step, the voltage between the terminals of the secondary battery is measured in a predetermined cycle from the time when the vehicle is determined to be in the stop state in the driving state determination step and the discharge current from the secondary battery is equal to or less than a predetermined value, the measured voltages between the terminals are approximated with an exponential function having time as a variable when the number of the measured voltages between the terminals reaches a predetermined number, and the open-circuit voltage OCV is estimated using the exponential function.

Another aspect of the secondary battery degradation determination method of the present invention is characterized in that in the open-circuit voltage measurement step, the voltage between the terminals of the secondary battery is measured after a predetermined period of time elapses from the time when the vehicle is determined to be in the stop state in the driving state determination step and the discharge current from the secondary battery is equal to or less than a predetermined value and the measured voltage is set to the open-circuit voltage OCV.

Another aspect of the secondary battery degradation determination method of the present invention is characterized in that the state of charge includes at least one of the charging rate, stratification, and polarization of the secondary battery.

Another aspect of the secondary battery degradation determination method of the present invention is characterized in that in the internal resistance correction step, the internal resistance R1 is corrected to the internal resistance R1c at a temperature that is lower than the reference temperature by a predetermined temperature.

Another aspect of the secondary battery degradation determination method of the present invention is characterized in that in the driving state determination step, the driving state of the vehicle is determined further using information of a communication device provided in the vehicle.

Another aspect of the secondary battery degradation determination method of the present invention is characterized in that in the degradation determination step, the secondary battery is determined to be insufficiently charged when the open-circuit voltage OCV is less than the first threshold value and the minimum voltage Vs is less than the second threshold value.

A first aspect of a secondary battery degradation determination device of the present invention is characterized by including: a current sensor that detects a current of a secondary battery; a voltage sensor that detects a voltage between terminals of the secondary battery; a temperature sensor that detects a temperature of the secondary battery; a driving state determination means for determining a driving state of a vehicle provided with the secondary battery using a current value input from the current sensor; an open-circuit voltage measurement means for measuring an open-circuit voltage OCV of the secondary battery; an internal resistance calculation means for receiving the current and the voltage between the terminals from the current sensor and the voltage sensor while the secondary battery is being discharged and calculating internal resistance R1 of the secondary battery; a maximum current detection means for, when a predetermined load provided in the vehicle is operated with a discharge current equal to or greater than a predetermined value, receiving the discharge current from the current sensor and detecting a maximum discharge current value Inew which is a maximum value of the discharge current; a maximum current update means for comparing the maximum discharge current value Inew detected by the maximum current detection means and a stored maximum discharge current value Is, updating the maximum discharge current value Is to the larger of the two maximum discharge current values, and storing the updated maximum discharge current value; a state-of-charge estimation means for estimating a state of charge of the secondary battery; a storage unit that stores a table or a relational expression which is made in advance and indicates a relation between the state of charge and temperature and the internal resistance of the secondary battery; an internal resistance correction means for reading the table or the relational expression from the storage unit and correcting the internal resistance R1 to internal resistance R1c at a predetermined reference temperature on the basis of the state of charge estimated by the state-of-charge estimation means and the temperature detected by the temperature sensor; a minimum voltage calculation means for calculating a minimum voltage Vs of the secondary battery when the load is operated based on the following expression:

$$Vs = OCV - R1c \times Is$$

using the open-circuit voltage OCV, the corrected internal resistance R1c, and the maximum discharge current value Is; and a degradation determination means for determining that the secondary battery has degraded when the open-circuit voltage OCV is equal to or greater than a first threshold value and the minimum voltage Vs is less than a second threshold value.

Another aspect of the secondary battery degradation determination device of the present invention is characterized by further including a discharge means for discharging the secondary battery in a predetermined discharge pattern; wherein the internal resistance calculation means calculates the internal resistance R1 using a current and a voltage between the terminals when the secondary battery is discharged by the discharge means.

Another aspect of the secondary battery degradation determination device of the present invention is characterized in that the internal resistance calculation means calculates the internal resistance R1 of the secondary battery using a load current and a response voltage before and after the load is operated.

Another aspect of the secondary battery degradation determination device of the present invention is characterized by further including a charging control means for controlling the charging of the secondary battery; wherein the degradation determination means determines that the secondary battery is not sufficiently charged when the open-circuit voltage OCV is less than the first threshold value and the minimum voltage Vs is less than the second threshold value, and the charging control means shifts a charge-discharge balance target to a charging side.

Effect of the Invention

According to the invention, it is possible to provide a secondary battery degradation determination method and a secondary battery degradation determination device which can detect the degradation of a secondary battery in advance even before an engine starts.

MODE(S) FOR CARRYING OUT THE INVENTION

Figure 1A:
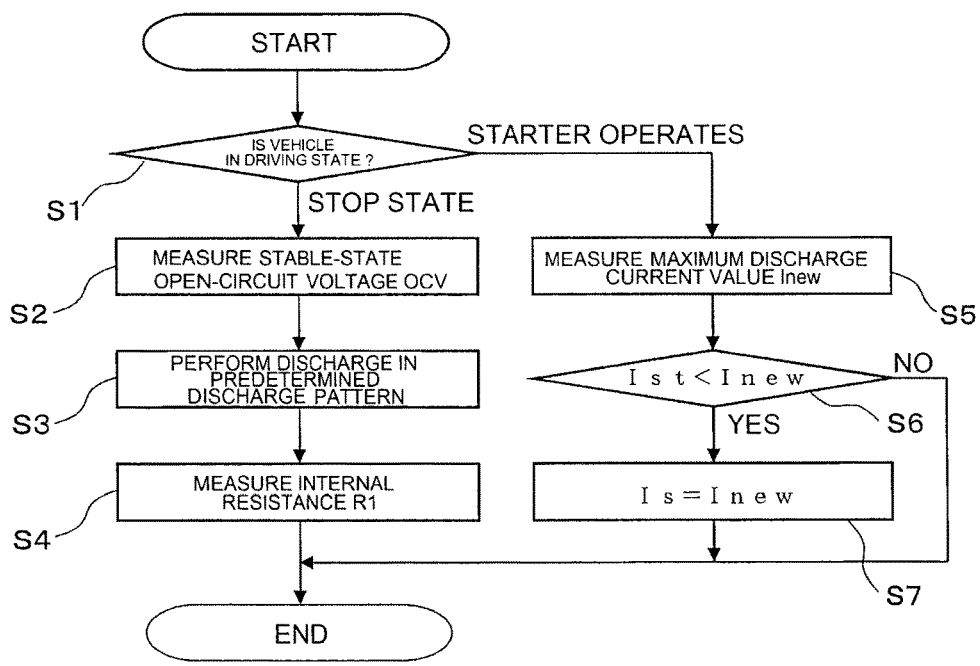
FIG. 1A is a flowchart illustrating the flow of a process of a secondary battery degradation determination method according to a first embodiment of the invention.

A secondary battery degradation determination method and a secondary battery degradation determination device according to preferred embodiments of the invention will be described in detail with reference to the drawings. Each component having the same function is denoted by the same reference numeral for the purpose of simplifying the drawings and description.

First Embodiment

Figure 1B:
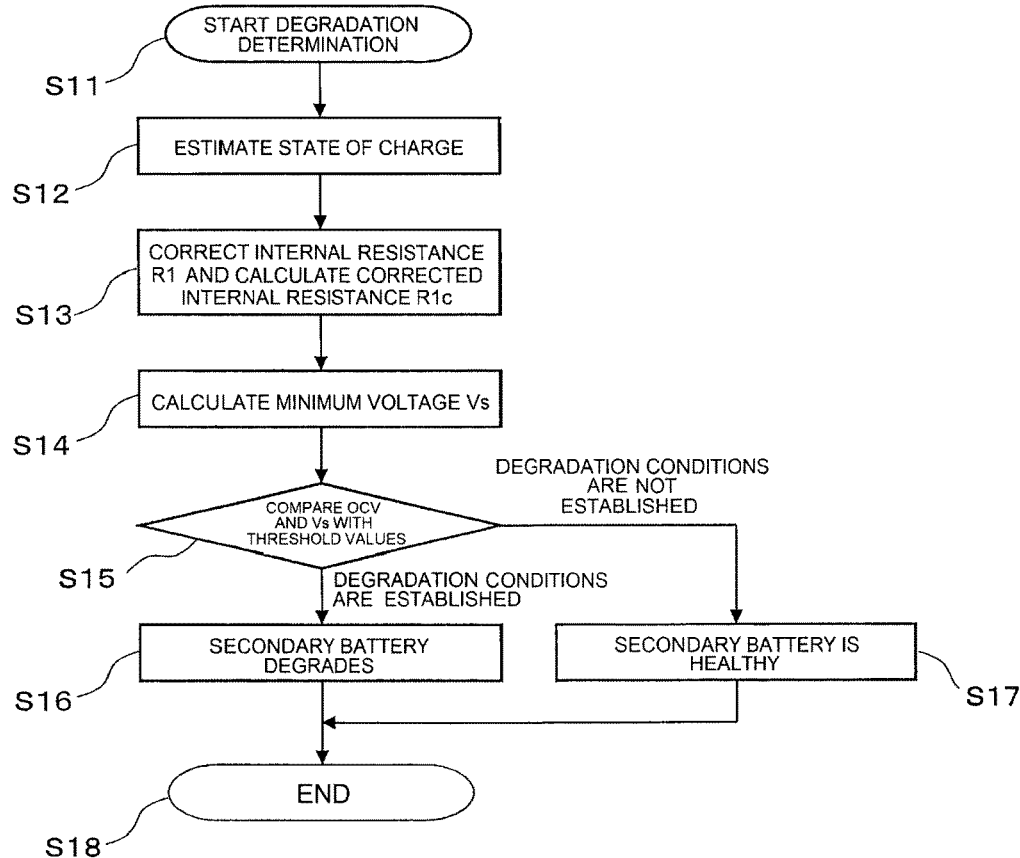
FIG. 1B is a flowchart illustrating the flow of a degradation determination process performed at a predetermined timing according to the first embodiment of the invention.
Figure 2:
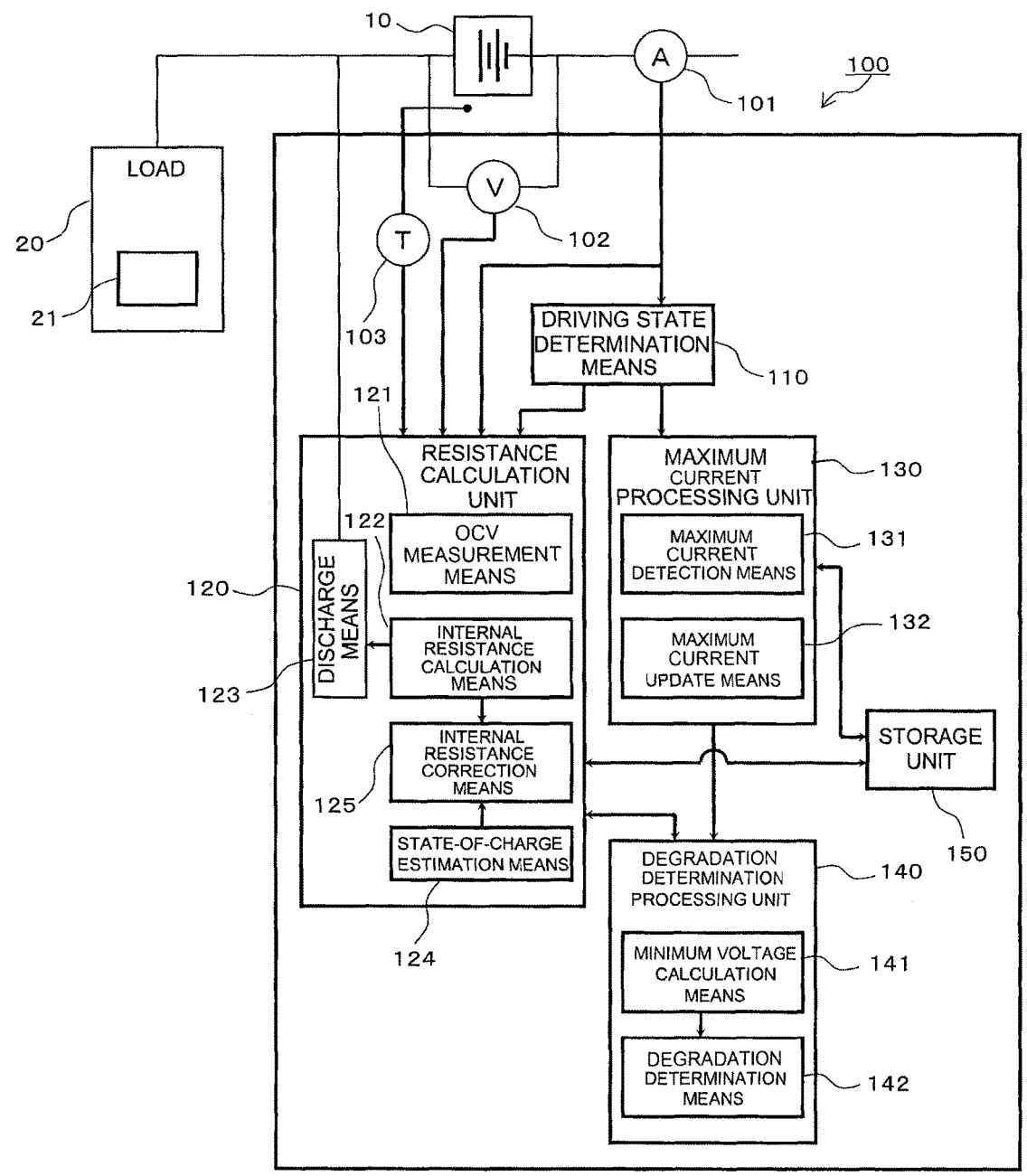
FIG. 2 is a block diagram illustrating the structure of a secondary battery degradation determination device according to the first embodiment of the invention.

A secondary battery degradation determination method and a secondary battery degradation determination device according to a first embodiment of the invention will be described with reference to FIGS. 1A, 1B and 2. Each of FIGS. 1A and 1B is a flowchart illustrating the flow of a process of the secondary battery degradation determination method according to this embodiment. FIG. 2 is a block diagram illustrating the structure of a secondary battery degradation determination device 100 according to this embodiment.

A secondary battery 10 which is provided in a vehicle is connected to a load 20, such as a starter for starting an engine, lights, or an air conditioner. The secondary battery degradation determination device 100 according to this embodiment determines the degradation of the secondary battery 10 provided in the vehicle. The secondary battery degradation determination device 100 includes a current sensor 101, a voltage sensor 102, and a temperature sensor 103 which measure and acquire the current, voltage, and temperature of the secondary battery 10, respectively.

The secondary battery degradation determination device 100 according to this embodiment performs the following process according to the driving state of the vehicle. First, when the vehicle is in a stop state and discharge from the secondary battery 10 is stopped or is sufficiently small, the secondary battery degradation determination device 100 measures a stable-state open-circuit voltage OCV and internal resistance of the secondary battery 10. The secondary battery degradation determination device 100 calculates a minimum voltage Vs when a predetermined load (hereinafter, referred to as a target load 21) is started with a discharge current that is equal to or greater than a predetermined value, using the stable-state open-circuit voltage OCV and the internal resistance. Furthermore, the secondary battery degradation determination device 100 determines the degradation state of the secondary battery 10 on the basis of the minimum voltage Vs and the stable-state open-circuit voltage OCV. In the following description, the starter which is used to start the engine and causes a large amount of discharge current from the secondary battery 10 is used as the target load 21. However, the target load 21 is not limited to the starter.

The secondary battery degradation determination device 100 includes a driving state determination means 110 for determining the driving state of the vehicle. In addition, the secondary battery degradation determination device 100 includes a resistance calculation unit 120 which measures the stable-state open-circuit voltage OCV and internal resistance of the secondary battery 10, a maximum current processing unit 130 which measures the maximum value (maximum discharge current value) of the discharge current flowing to the starter 21 when the engine starts, and a degradation determination processing unit 140 which determines the degradation state of the secondary battery 10. Furthermore, the secondary battery degradation determination device 100 includes a storage unit 150 which stores data.

The driving state determination means 110 receives the current value of the secondary battery 10 from the current sensor 101 and determines that the vehicle is in the stop state when the discharge current from the secondary battery 10 is stopped or is sufficiently small. When the vehicle is in the stop state, the discharge current from the secondary battery 10 is not necessarily zero, but a very small amount of current (dark current) is likely to flow to a load, such as a communication device or a security device. Therefore, the stop state of the vehicle is determined on the basis of a threshold value greater than the dark current.

In addition, the driving state determination means 110 determines whether the starter 21 is operated to start the engine using the current value input from the current sensor 101. A control signal for requiring the operation of the starter 21 may be used to perform the determination. When determining the driving state of the vehicle, the driving state determination means 110 transmits the determination result to the resistance calculation unit 120 and the maximum current processing unit 130.

The resistance calculation unit 120 includes an open-circuit voltage measurement means 121 for measuring the stable-state open-circuit voltage OCV of the secondary battery 10, an internal resistance calculation means 122 for calculating the internal resistance R1 of the secondary battery 10, a discharge means 123 for discharging the secondary battery 10 in a predetermined discharge pattern, a state-of-charge estimation means 124 for estimating the state of charge of the secondary battery 10, and an internal resistance correction means 125 for correcting the internal resistance R1 to corrected internal resistance R1c at a predetermined reference temperature.

When receiving the determination result indicating that the vehicle is in the stop state from the driving state determination means 110, the resistance calculation unit 120 executes the open-circuit voltage measurement means 121 and the internal resistance calculation means 122 at a predetermined timing. In addition, the discharge means 123 is performed in response to a request from the internal resistance calculation means 122. The state-of-charge estimation means 124 and the internal resistance correction means 125 are performed in response to requests from the degradation determination processing unit 140.

The open-circuit voltage measurement means 121 measures the stable-state open-circuit voltage OCV which is a voltage between the terminals when the secondary battery 10 is stable in an open-circuit state. The following two methods are used to measure the stable-state open-circuit voltage OCV. One or both of the two methods may be used. The measured stable-state open-circuit voltage OCV is stored in, for example, the storage unit 150.

The first method for measuring the stable-state open-circuit voltage OCV measures the voltage (open-circuit voltage) between the terminals in a predetermined cycle from the time when the engine of the vehicle is stopped and the discharge current from the secondary battery 10 is equal to or less than a predetermined value, and approximates the voltage with an exponential function having time as a variable when the number of the voltage values reaches a predetermined number. An approximate expression of the exponential function is obtained by using the voltage values of the predetermined number which are measured in a short time. Therefore, it is possible to estimate the stable-state open-circuit voltage OCV when a long period of time has elapsed after the discharge from the secondary battery 10 has been stopped or sufficiently reduced using the approximate expression.

The second method for measuring the stable-state open-circuit voltage OCV measures the voltage (open-circuit voltage) between the terminals of the secondary battery 10 when a predetermined period of time has elapsed after the engine of the vehicle has been stopped and the discharge current from the secondary battery 10 has been equal to or less than a predetermined value and uses the measured voltage as the stable-state open-circuit voltage OCV. In this method, the time elapsed after the discharge current is reduced to a predetermined value or less needs to be about a day. Therefore, it is preferable that the stable-state open-circuit voltage OCV is measured by the first method in a beginning after the vehicle is stopped and that the stable-state open-circuit voltage OCV is measured by the second method and updated when the period for which the vehicle is stopped is a day or more.

The internal resistance calculation means 122 according to this embodiment is performed when the driving state determination means 110 determines that the vehicle is in the stop state. The internal resistance calculation means 122 executes the discharge means 123 at a predetermined timing after the vehicle is stopped. The discharge means 123 is composed of, for example, a semiconductor switch, a resistance element and the like which are connected in series and discharges the secondary battery 10 in a predetermined discharge pattern. It is preferable that the discharge pattern of the discharge means 123 is set so as to include a predetermined discharge frequency of the discharge current when the starter 21, which is a target load, is operated. For example, a substantially square wave may be used as the discharge pattern. Alternatively, a sine wave with a predetermined discharge frequency may be used as the discharge pattern.

The internal resistance calculation means 122 measures the current and the voltage between the terminals when the discharge means 123 discharges the secondary battery 10 from the current sensor 101 and the voltage sensor 102, respectively. Then, the internal resistance R1 of the secondary battery 10 is calculated using a current and voltage response at that time. The obtained internal resistance R1 of the secondary battery 10 is stored in, for example, the storage unit 150.

When the driving state determination means 110 determines that the starter 21 is operated, the process of the maximum current processing unit 130 is performed. The maximum current processing unit 130 includes a maximum current detection means 131 and a maximum current update means 132. First, the maximum current detection means 131 is performed. The maximum current detection means 131 measures, from the current sensor 101, the discharge current while the starter 21 is operated to start the engine and detects the maximum value (maximum discharge current value) Inew of the discharge current at that time. When the maximum current detection means 131 detects the maximum discharge current value Inew, the maximum current update means 132 is performed.

The maximum current update means 132 receives the maximum discharge current value Is stored in the storage unit 150 and compares the maximum discharge current value Is with the latest maximum discharge current value Inew detected by the maximum current detection means 131. When the latest maximum discharge current value Inew is greater than the maximum discharge current value Is, the maximum current update means 132 updates the maximum discharge current value Is stored in the storage unit 150 with the latest maximum discharge current value Inew and stores the updated maximum discharge current value.

It is preferable that the determination of the degradation of the secondary battery 10 is appropriately performed by the degradation determination processing unit 140. For example, the determination may be performed immediately before the engine starts. Alternatively, the determination may be periodically performed at a predetermined interval. Even when the vehicle is in the stop state, the degradation determination processing unit 140 can be appropriately performed to detect the degradation of the secondary battery 10 in the early stage before the engine starts.

The degradation determination processing unit 140 includes a minimum voltage calculation means 141 and a degradation determination means 142. When the process of the degradation determination processing unit 140 starts, first, the state-of-charge estimation means 124 and the internal resistance correction means 125 provided in the resistance calculation unit 120 are sequentially performed. Then, the minimum voltage calculation means 141 calculates the minimum voltage when the engine starts, using the internal resistance of the secondary battery 10 corrected by the internal resistance correction means 125. Then, the degradation determination of the secondary battery 10 is performed by the degradation determination means 142 on the basis of the minimum voltage.

The state-of-charge estimation means 124 estimates the state of charge of the secondary battery 10 when the degradation determination is performed by the degradation determination processing unit 140. Here, the state of charge includes the charging rate of the secondary battery 10 and may also include the polarization, stratification or the like of the secondary battery 10. The charging rate can be calculated by, for example, a method for integrating a charge/discharge current. Alternatively, the charging rate can be calculated from a predetermined correlation equation, using the stable-state open-circuit voltage calculated by the open-circuit voltage measurement means 121. The polarization or stratification can be estimated, for example, using a predetermined table or function based on a charge/discharge history or the like.

The internal resistance correction means 125 receives the temperature of the secondary battery 10 from the temperature sensor 103. In addition, the internal resistance correction means 125 receives the internal resistance R1 calculated by the internal resistance calculation means 122 and the state of charge estimated by the state-of-charge estimation means 124. Furthermore, the internal resistance correction means 125 reads, from the storage unit 150, a table or a relational expression indicating the relation between the state of charge and temperature and the internal resistance of the secondary battery 10 which is created in advance and then stored in the storage unit 150.

The internal resistance correction means 125 corrects the internal resistance R1 to an internal resistance value at the reference temperature on the basis of the table or relational expression read from the storage unit 150 and the temperature and the state of charge of the secondary battery 10. Then, the internal resistance value is output as the corrected internal resistance R1c to the minimum voltage calculation means 141. When the relational expression indicating the relation between the state of charge and temperature and the internal resistance stored in the storage unit 150 is, for example, denoted with f (T, SOC), the corrected internal resistance R1c can be calculated by the following expression:

$$R1c = R1 \times f(T, SOC).$$

Where, T indicates the temperature of the secondary battery 10 and SOC indicates the charging rate which is one of the states of charge.

The minimum voltage calculation means 141 receives the corrected internal resistance R1c and the stable-state open-circuit voltage OCV from the resistance calculation unit 120 and receives the updated maximum discharge current value Is which is updated by the maximum current processing unit 130 from the storage unit 150. Then, the minimum voltage calculation means 141 calculates the minimum voltage Vs using the following expression:

$$Vs = OCV - R1c \times Is.$$

The minimum voltage Vs calculated by the expression shown above is the minimum voltage of the secondary battery 10 which is generated by a voltage drop caused by discharge when the engine starts.

Figure 3:
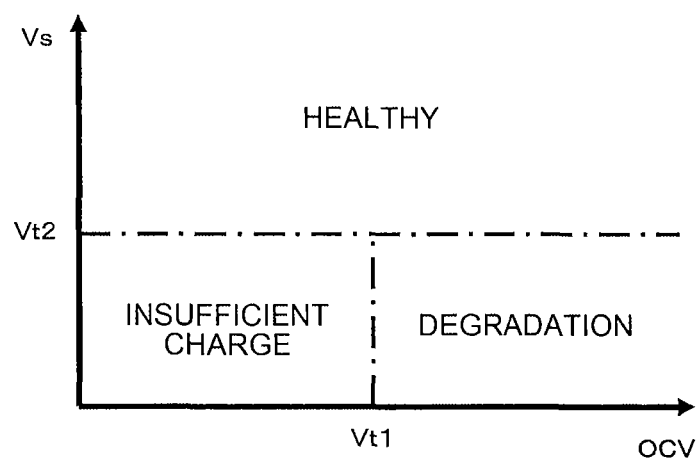
FIG. 3 is a graph illustrating an example of a threshold value that is used for degradation determination in the secondary battery degradation determination method according to the first embodiment.

The degradation determination means 142 receives the stable-state open-circuit voltage OCV and the minimum voltage Vs calculated by the minimum voltage calculation means 141 and determines the degradation of the secondary battery 10 on the basis of a predetermined threshold value. FIG. 3 illustrates an example of the threshold value which is used for the determination of degradation by the degradation determination means 142. The degradation determination means 142 performs the degradation determination of the secondary battery 10 using a first threshold value Vt1 for the stable-state open-circuit voltage OCV and a second threshold value Vt2 for the minimum voltage Vs.

In FIG. 3, when the stable-state open-circuit voltage OCV is equal to or greater than the first threshold value Vt1 and the minimum voltage Vs is less than the second threshold value Vt2, it is determined that the secondary battery 10 has degraded. When the stable-state open-circuit voltage OCV is less than the first threshold value Vt1 and the minimum voltage Vs is less than the second threshold value Vt2, it is determined that the secondary battery 10 has not been sufficiently charged. When the minimum voltage Vs is equal to or greater than the second threshold value Vt2, it is determined that the secondary battery 10 is in an appropriate state, regardless of the stable-state open-circuit voltage OCV.

The flow of the process of a secondary battery degradation determination method according to this embodiment which performs the degradation determination of the secondary battery 10 in the secondary battery degradation determination device 100 according to this embodiment will be described in further detail with reference to FIGS. 1A and 1B. FIG. 1A illustrates the flow of the process which is performed on the basis of the driving state of the vehicle and FIG. 1B illustrates the flow of a degradation determination process which is performed at a predetermined timing.

In the process based on the driving state illustrated in FIG. 1A, the driving state determination means 110 receives the current value from the current sensor 101, for example, in a predetermined cycle and determines the driving state of the vehicle on the basis of the current value (Step S1). When the determination result of the driving state shows that the vehicle is in the stop state, the process proceeds to Step S2. When it is determined that the starter (target load) 21 is operated, the process proceeds to Step S5.

In Step S2, the open-circuit voltage measurement means 121 is used to measure the stable-state open-circuit voltage OCV. Then, in Step S3, the discharge means 123 is performed in response to a request from the internal resistance calculation means 122 and the secondary battery 10 is discharged in a predetermined discharge pattern. Then, in Step S4, the internal resistance calculation means 122 calculates the internal resistance R1 of the secondary battery 10 from a current and voltage response during discharge. The order of the process of Step S2 by the open-circuit voltage measurement means 121 and the processes of Steps S3 and S4 by the internal resistance calculation means 122 is not particularly limited. The measurement of the internal resistance R1 by the internal resistance calculation means 122 may be performed only once after the vehicle is stopped or may be performed, for example, at a predetermined interval after the vehicle is stopped.

When it is determined in Step S1 that the starter 21 is operated, the maximum current detection means 131 measures the maximum discharge current value Inew in Step S5 while the starter 21 is operating. In Step S6, the measured latest maximum discharge current value Inew is compared with the maximum discharge current value Is stored in the storage unit 150. When the latest maximum discharge current value Inew is greater than the stored maximum discharge current value Is, the maximum discharge current value Is is updated with the latest maximum discharge current value Inew in Step S7. The processes of Steps S6 and S7 are performed by the maximum current update means 132.

Then, the flow of the degradation determination process will be described with reference to FIG. 1B. When the degradation determination starts in Step S11, the state-of-charge estimation means 124 estimates the state of charge of the secondary battery 10 in Step S12. Then, in Step S13, the internal resistance correction means 125 corrects the internal resistance R1 to the internal resistance R1c at the reference temperature using the temperature and the state of charge of the secondary battery 10 and a predetermined table or function. In Step S14, the minimum voltage calculation means 141 calculates the minimum voltage Vs using the stable-state open-circuit voltage OCV, the updated maximum discharge current value Is, and the corrected internal resistance R1c.

In Step S15, the degradation determination means 142 compares the stable-state open-circuit voltage OCV with the first threshold value Vt1 and compares the minimum voltage Vs with the second threshold value Vt2. As a result, when the stable-state open-circuit voltage OCV is equal to or greater than the first threshold value Vt1 and the minimum voltage Vs is less than the second threshold value Vt2, it is determined that the secondary battery 10 has degraded and the process proceeds to Step S16. When the stable-state open-circuit voltage OCV is less than the first threshold value Vt1 and the minimum voltage Vs is less than the second threshold value Vt2, it is determined that the secondary battery 10 has not been sufficiently charged and the process proceeds to Step S17. When the other determination results are obtained in Step S15, the process proceeds to Step S18 and ends.

In Step S16, a process when the secondary battery 10 is determined to degrade is performed. For example, information indicating that the secondary battery 10 has degraded is notified to the driver to guide the driver to replace the secondary battery 10. In Step S17, the driver can be notified that the secondary battery 10 has not been sufficiently charged.

According to the secondary battery degradation determination method and the secondary battery degradation determination device 100 of this embodiment, even for the period for which the vehicle is stopped, the internal resistance calculation means 122 can periodically calculate the internal resistance R1 of the secondary battery 10 and the degradation determination processing unit 140 can perform the degradation determination of the secondary battery 10. Therefore, even when the vehicle is in the stop state for a long time, it is possible to determine whether the secondary battery 10 degrades or not before the engine starts.

In the determination of the degradation of the secondary battery 10 in this embodiment, the internal resistance is corrected to the internal resistance at a predetermined reference temperature and is then used. Therefore, for example, it is possible to perform the degradation determination of the secondary battery 10 with high accuracy, regardless of whether the internal temperature of the engine room is high or low. In addition, the internal resistance is corrected with respect to the influence of the state of charge of the secondary battery 10, such as the charging rate, internal stratification (electrolytic solution is inhomogeneous), and polarization, and is then used. Therefore, it is possible to perform the degradation determination of the secondary battery 10 with high accuracy, regardless of the charge and discharge history of the secondary battery 10. In this embodiment, the minimum voltage is calculated and used for the degradation determination. Since the maximum value of the discharge current when the engine starts is used as the maximum discharge current value used to calculate the minimum voltage, it is possible to perform the degradation determination of the secondary battery 10 under the severest conditions.

In the above-described embodiment, the internal resistance correction means 125 corrects the internal resistance R1 calculated by the internal resistance calculation means 122 to the internal resistance at the reference temperature to calculate the corrected internal resistance R1c. The reference temperature is set to, for example, 25° C. The internal resistance may be corrected to internal resistance at a predetermined temperature different from the reference temperature without being limited to the reference temperature. For example, a corrected internal resistance at a temperature (for example, 10° C.) that is lower than the reference temperature by a predetermined temperature can be used as the corrected internal resistance R1c. Since the internal resistance of the secondary battery is large at a low temperature, a voltage drop which is caused by discharge when the engine starts also increases and thereby reduces the minimum voltage of the secondary battery 10. Therefore, it is possible to perform the degradation determination of the secondary battery 10 under the conditions severer than that when the internal resistance at the reference temperature is used. In Step S13 illustrated in FIG. 1B, the internal resistance correction means 125 corrects the internal resistance R1 to the internal resistance R1c at a temperature that is lower than the reference temperature by a predetermined temperature, using the table or the relational expression indicating the relation between the state of charge and temperature and the internal resistance, and the temperature and state of charge of the secondary battery 10. Subsequently, the processes of Steps S14 to S17 are performed to perform the degradation determination of the secondary battery 10.

Figure 6:
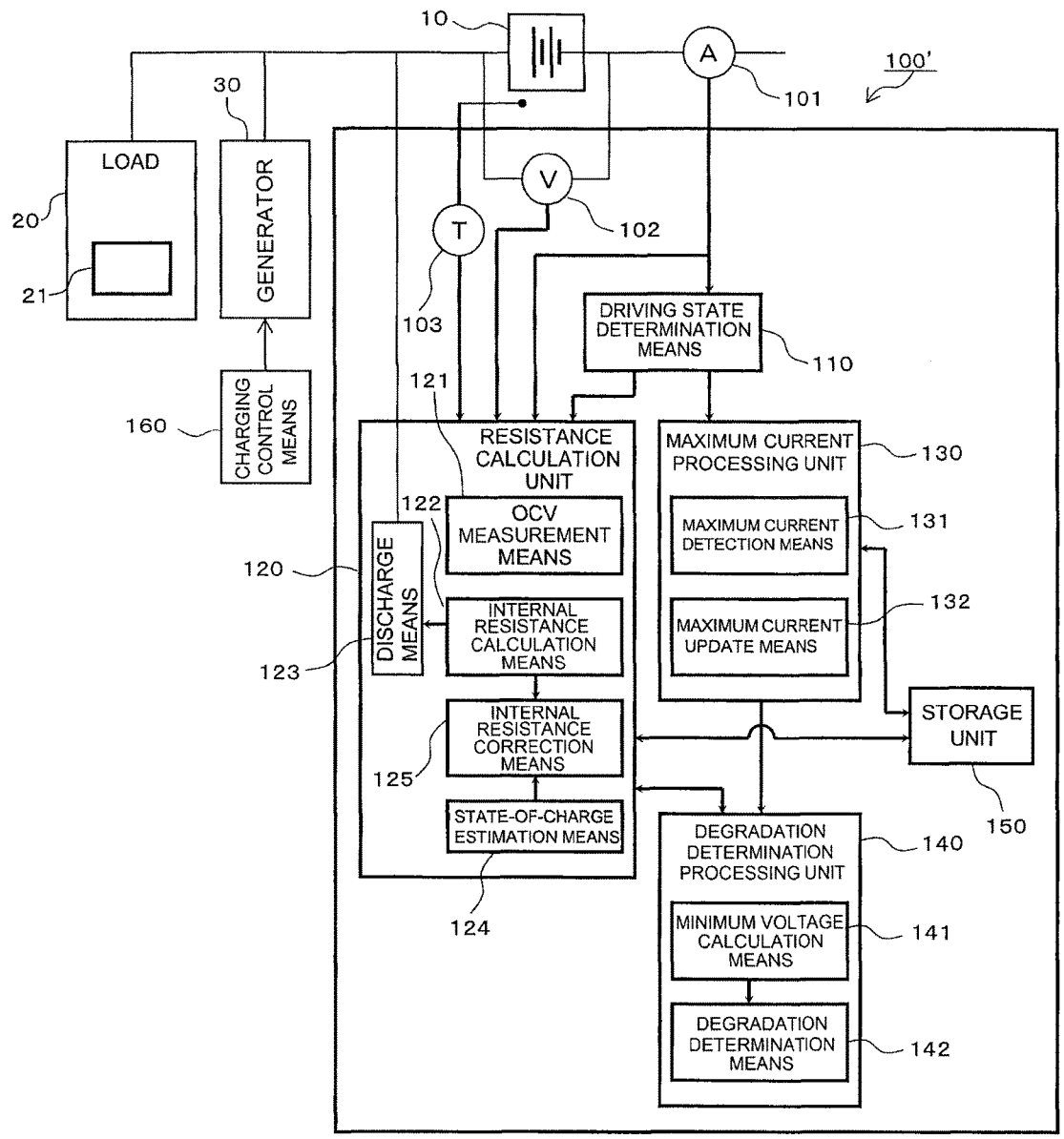
FIG. 6 is a block diagram illustrating the structure of an application example in which a charging control means is added to the secondary battery degradation determination device according to the first embodiment.

FIG. 6 illustrates an application example of this embodiment. FIG. 6 illustrates the structure of an application example 100' in which a charging control means 160 is added to the secondary battery degradation determination device 100 according to the first embodiment. The charging control means 160 is connected to an generator 30 and has a function of controlling the charging of the secondary battery 10 on the basis of the state of the secondary battery 10. Specifically, when the secondary battery 10 is close to a full charge, the charging control means 160 reduces the output of the generator 30 and increases the discharge current which flows from the secondary battery 10 to the load 20. On the other hand, when the charging rate of the secondary battery 10 is low, the charging control means 160 increases the output of the generator 30 and reduces the discharge current which flows from the secondary battery 10 to the load 20, or charges the secondary battery 10. In this embodiment, in Step S17 illustrated in FIG. 1B, when it is determined that the secondary battery 10 has not been sufficiently charged, the charging control means 160 performs control such that the secondary battery 10 is charged. The addition of the charging control means 160 makes it possible to prevent the secondary battery 10 from being insufficiently charged in an early stage and to prevent trouble in the operation of the load due to insufficient charging.

Second Embodiment

Figure 4:
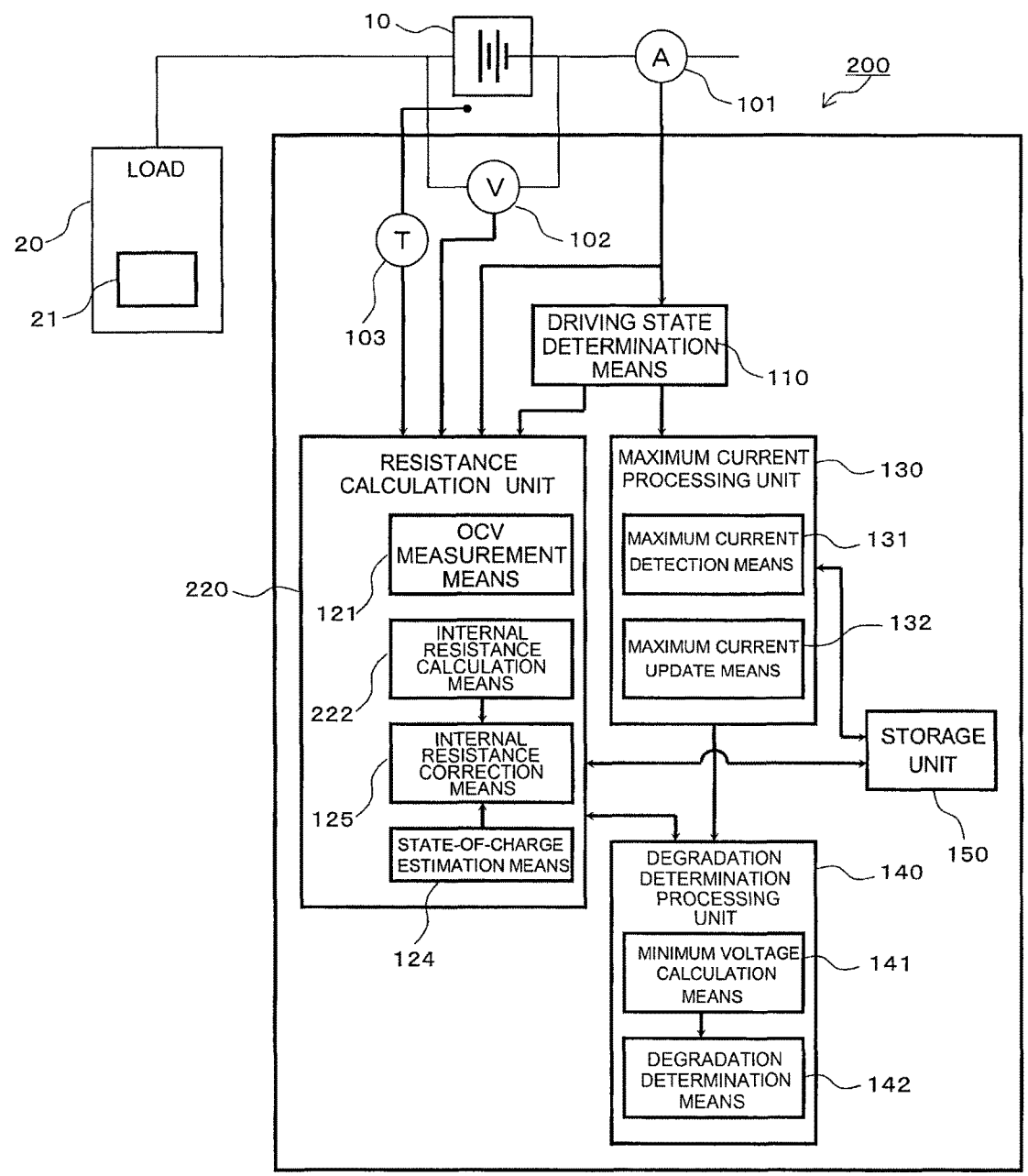
FIG. 4 is a block diagram illustrating the structure of a secondary battery degradation determination device according to a second embodiment of the invention.

A secondary battery degradation determination method and a secondary battery degradation determination device according to a second embodiment of the invention will be described with reference to FIG. 4. FIG. 4 is a block diagram illustrating the structure of a secondary battery degradation determination device 200 according to this embodiment.

The secondary battery degradation determination device 200 according to this embodiment differs from the secondary battery degradation determination device 100 according to the first embodiment in that a resistance calculation unit 220 does not include the discharge means 123. In this embodiment, the internal resistance R1 of the secondary battery 10 is measured using a current and voltage response when a target load 21 is operated with a discharge current equal to or greater than a predetermined value, instead of performing discharge in a predetermined discharge pattern when the vehicle is stopped. In this embodiment, a starter for starting the engine is used as the target load 21.

Figure 5:
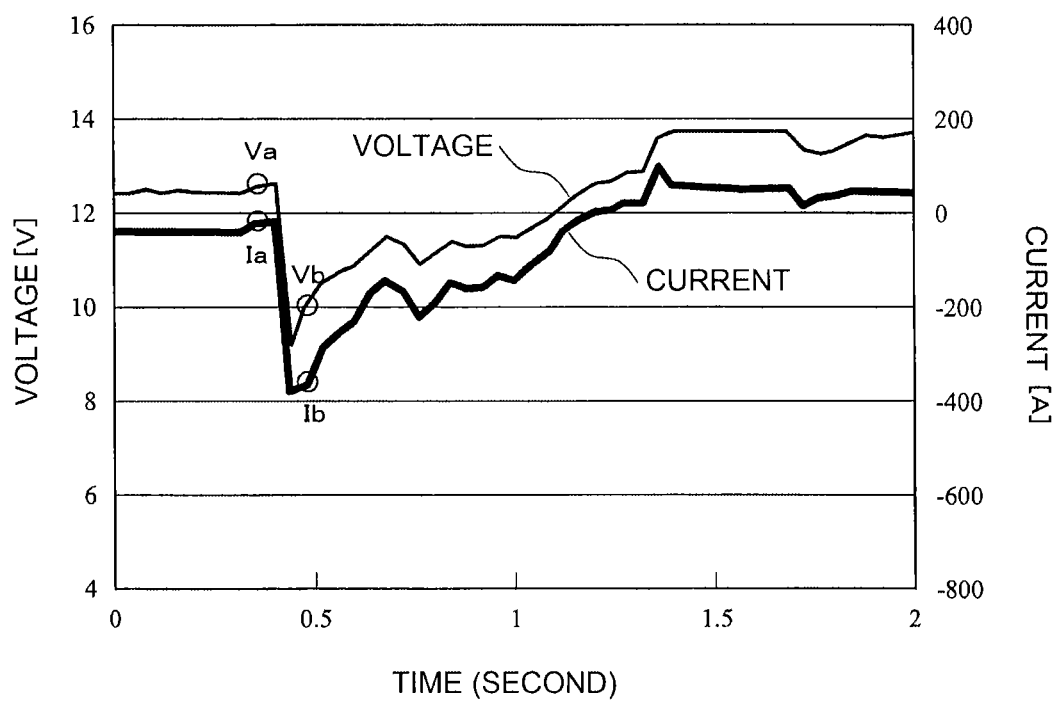
FIG. 5 is a graph illustrating an example of a current and voltage response when a starter is operated to start an engine.

FIG. 5 illustrates an example of a current and voltage response when the starter 21 is operated to start the engine. In FIG. 5, the voltage and current of the secondary battery 10 before the starter 21 operates are denoted with Va and Ia, respectively, and the voltage and current after a predetermined period of time has elapsed from the detection of the operation of the starter 21 are denoted with Vb and Ib, respectively. An internal resistance calculation means 222 according to this embodiment measures the voltages Va and Vb and the currents Ia and Ib before and after the starter 21 is operated from the voltage sensor 102 and the current sensor 101, respectively.

The internal resistance calculation means 222 calculates the internal resistance R1 using the voltages Va and Vb and the currents Ia and Ib with the following expression:

$$R1=(Vb-Va)/(Ib-Ia).$$

When a degradation determination processing unit 140 performs the degradation determination of the secondary battery 10, the internal resistance R1 calculated by the expression shown above is corrected by an internal resistance correction means 125 and is used to calculate the minimum voltage Vs, similarly to the first embodiment.

In this embodiment, the internal resistance of the secondary battery 10 is measured using the current and voltage response when the starter 21 is operated to start the engine. However, the invention is not limited thereto. The internal resistance may be measured using a current and voltage response when another load is operated with a discharge current equal to or greater than a predetermined value. Alternatively, the internal resistance may be measured using a current and voltage response during charging. According to the secondary battery degradation determination method and the secondary battery degradation determination device 200 of this embodiment, it is not necessary to perform discharge in order to measure the internal resistance. Therefore, it is possible to suppress the discharge of the secondary battery 10.

The description in the embodiments only shows examples of the secondary battery degradation determination method and the secondary battery degradation determination device according to the present invention and is not limited thereto. Detailed structure, detailed operation, etc. of the secondary battery degradation determination method and the secondary battery degradation determination device according to the embodiments may be appropriately changed, without departing from the spirit of the present invention.

EXPLANATIONS OF LETTERS OR NUMERALS

10 SECONDARY BATTERY
20 LOAD
30 GENERATOR
100, 200 SECONDARY BATTERY DEGRADATION DETERMINATION DEVICE
101 CURRENT SENSOR
102 VOLTAGE SENSOR
103 TEMPERATURE SENSOR
110 DRIVING STATE DETERMINATION MEANS
120 RESISTANCE CALCULATION UNIT
121 OPEN-CIRCUIT VOLTAGE MEASUREMENT MEANS
122, 222 INTERNAL RESISTANCE CALCULATION MEANS
123 DISCHARGE MEANS
124 STATE-OF-CHARGE ESTIMATION MEANS
125 INTERNAL RESISTANCE CORRECTION MEANS
130 MAXIMUM CURRENT PROCESSING UNIT
131 MAXIMUM CURRENT DETECTION MEANS
132 MAXIMUM CURRENT UPDATE MEANS
140 DEGRADATION DETERMINATION PROCESSING UNIT
141 MINIMUM VOLTAGE CALCULATION MEANS
142 DEGRADATION DETERMINATION MEANS
150 STORAGE UNIT
160 CHARGING CONTROL MEANS

The invention claimed is:

1. A secondary battery degradation determination method comprising:
   determining, with circuitry, a driving state of a vehicle provided with a secondary battery on the basis of a current value of the secondary battery;
   measuring, with the circuitry, an open-circuit voltage (OCV) of the secondary battery;
   detecting, with the circuitry, a current and a voltage between terminals while the secondary battery is being discharged and calculating internal resistance R of the secondary battery;
   when a predetermined load provided in the vehicle is operated with a discharge current equal to or greater than a predetermined value, detecting, with the circuitry, a maximum discharge current value Inew which is a maximum value of the discharge current;
   comparing, with the circuitry, the detected maximum discharge current value Inew with a stored maximum discharge current value Is, updating, with the circuitry, the maximum discharge current value Is to a larger of the two maximum discharge current values, and storing, with the circuitry, the updated maximum discharge current value;
detecting, with the circuitry, a temperature of the secondary battery;
estimating, with the circuitry, a state of charge of the secondary battery;
correcting, with the circuitry, the internal resistance R1 to internal resistance R1c at a predetermined reference temperature, on the basis of the state of charge and the temperature of the secondary battery, using a table or a relational expression which is made in advance to indicate a relation between the internal resistance and the state of charge and temperature of the secondary battery;
calculating, with the circuitry, a minimum voltage Vs of the secondary battery when the load is operated based on the following expression:

$$V_s = OCV - R1c \times Is$$

using the open-circuit voltage OCV, the corrected internal resistance R1c, and the maximum discharge current value Is;
determining, using the circuitry, that the secondary battery has degraded when the open-circuit voltage OCV is equal to or greater than a first threshold value and the minimum voltage Vs is less than a second threshold value; and
outputting, by the circuitry, a notification to a user of the vehicle that the secondary battery has degraded based on the determination by the circuitry that the secondary battery has degraded.

2. The secondary battery degradation determination method according to claim 1,
wherein when calculating the internal resistance, the secondary battery is discharged in a predetermined discharge pattern, a current and a voltage between the terminals are detected while the secondary battery is discharged in the predetermined discharge pattern, and the internal resistance R1 of the secondary battery is calculated;
when the vehicle is determined to be in a stopped state, open-circuit voltage measurement and internal resistance calculation are performed;
when the load is determined to be operated, maximum current detection and maximum current update are performed; and
when the degradation determination of the secondary battery is performed, temperature detection, state-of-charge estimation, internal resistance correction, minimum voltage calculation, and degradation determination are performed.

3. The secondary battery degradation determination method according to claim 2, wherein the predetermined discharge pattern is a substantially square wave including a predetermined discharge frequency of a discharge current when the load is operated.

4. The secondary battery degradation determination method according to claim 2, wherein internal resistance calculation is performed in a predetermined cycle or in response to a predetermined execution request when the vehicle is in the stopped state.

5. The secondary battery degradation determination method according to claim 3, wherein internal resistance calculation is performed in a predetermined cycle or in response to a predetermined execution request when the vehicle is in the stopped state.

6. The secondary battery degradation determination method according to claim 1,
wherein during internal resistance calculation, the internal resistance R1 of the secondary battery is calculated using a load current and a response voltage before and after the load is operated;
when the vehicle is determined to be in a stopped state, open-circuit voltage measurement is performed;
when the load is determined to be operated, internal resistance calculation, maximum current detection, and maximum current update are performed; and
when the degradation determination of the secondary battery is performed, temperature detection, state-of-charge estimation, internal resistance correction, minimum voltage calculation, and degradation determination are performed.

7. The secondary battery degradation determination method according to claim 1,
wherein during open-circuit voltage measurement, the voltage between the terminals of the secondary battery is measured in a predetermined cycle from the time when the vehicle is determined to be in the stopped state and the discharge current from the secondary battery is equal to or less than a predetermined value, the measured voltages between the terminals are approximated with an exponential function having time as a variable when the number of the measured voltages between the terminals reaches a predetermined number, and the open-circuit voltage OCV is estimated using the exponential function.

8. The secondary battery degradation determination method according to claim 1,
wherein during open-circuit voltage measurement, the voltage between the terminals of the secondary battery is measured after a predetermined period of time elapses from the time when the vehicle is determined to be in the stopped state and the discharge current from the secondary battery is equal to or less than a predetermined value and the measured voltage is set to the open-circuit voltage OCV.

9. The secondary battery degradation determination method according to claim 1, wherein the state of charge includes at least one of the charging rate, stratification, and polarization of the secondary battery.

10. The secondary battery degradation determination method according to claim 1, wherein during internal resistance correction, the internal resistance R1 is corrected to the internal resistance R1c at a temperature that is lower than the reference temperature by a predetermined temperature.

11. The secondary battery degradation determination method according to claim 1, wherein during driving state determination, the driving state of the vehicle is determined further using information of a communication device provided in the vehicle.

12. The secondary battery degradation determination method according to claim 1, wherein during degradation determination, the secondary battery is determined to be insufficiently charged when the open-circuit voltage OCV is less than the first threshold value and the minimum voltage Vs is less than the second threshold value.

13. A secondary battery degradation determination device comprising:
circuitry configured to
detect, using a current sensor, a current of a secondary battery;
detect, using a voltage sensor, a voltage between terminals of the secondary battery;

detect, using a temperature sensor, a temperature of the secondary battery;

determine a driving state of a vehicle provided with the secondary battery using a current value input from the current sensor;

measure an open-circuit voltage OCV of the secondary battery;

receive the current and the voltage between the terminals from the current sensor and the voltage sensor while the secondary battery is being discharged and calculate internal resistance R1 of the secondary battery;

when a predetermined load provided in the vehicle is operated with a discharge current equal to or greater than a predetermined value, receive the discharge current from the current sensor, and detect a maximum discharge current value Inew which is a maximum value of the discharge current;

compare the maximum discharge current value Inew and a stored maximum discharge current value Is, update the maximum discharge current value Is to a larger of the two maximum discharge current values, and store, in a memory, the updated maximum discharge current value;

estimate a state of charge of the secondary battery;

store, in the memory, a table or a relational expression which is made in advance and indicates a relation between the state of charge and temperature and the internal resistance of the secondary battery;

read the table or the relational expression from the memory and correct the internal resistance R1 to internal resistance R1c at a predetermined reference temperature on the basis of the state of charge and the temperature detected by the temperature sensor;

calculate a minimum voltage Vs of the secondary battery when the load is operated based on the following expression:

$$V_s = OCV - R1c \times Is$$

using the open-circuit voltage OCV, the corrected internal resistance R1c, and the maximum discharge current value Is; and determine that the secondary battery has degraded when the open-circuit voltage OCV is equal to or greater than a first threshold value and the minimum voltage Vs is less than a second threshold value, and output a notification to a user of the vehicle that the secondary battery has degraded based on the determination by the circuitry that the secondary battery has degraded.

14. The secondary battery degradation determination device according to claim 13, wherein the circuitry is further configured to:

discharge the secondary battery in a predetermined discharge pattern; and calculate the internal resistance R1 using a current and a voltage between the terminals when the secondary battery is discharged.

15. The secondary battery degradation determination device according to claim 13, wherein the circuitry is further configured to:

calculate the internal resistance R1 of the secondary battery using a load current and a response voltage before and after the load is operated.

16. The secondary battery degradation determination device according to claim 13, wherein the circuitry is further configured to:

control the charging of the secondary battery;

determine that the secondary battery has not been sufficiently charged when the open-circuit voltage OCV is less than the first threshold value and the minimum voltage Vs is less than the second threshold value; and shift a charge-discharge balance target to a charging side.

* * * * *